(12) United States Patent
Horng

(10) Patent No.: US 7,112,523 B2
(45) Date of Patent: Sep. 26, 2006

(54) BUMPING PROCESS

(75) Inventor: Ching-Fu Horng, Magung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 166 days.

(21) Appl. No.: 10/753,316

(22) Filed: Jan. 9, 2004

(65) Prior Publication Data
US 2004/0266161 A1 Dec. 30, 2004

(30) Foreign Application Priority Data
Jun. 30, 2003 (TW) .............................. 92117867 A

(51) Int. Cl.
H01L 23/48 (2006.01)
H01L 21/44 (2006.01)

(52) U.S. Cl. .............................. 438/614; 257/E23.012

(58) Field of Classification Search ................ 438/654, 438/613, 614, 653; 257/E23.012
See application file for complete search history.

(56) References Cited

U.S. PATENT DOCUMENTS

| 5,162,257 | A | 11/1992 | Yung |
| 5,462,638 | A | 10/1995 | Datta et al. |
| 5,508,229 | A | 4/1996 | Baker |
| 6,013,572 | A | 1/2000 | Hur et al. |
| 6,249,044 | B1 * | 6/2001 | Kao et al. .................... 257/678 |
| 6,293,457 | B1 * | 9/2001 | Srivastava et al. .......... 228/254 |
| 6,426,281 | B1 * | 7/2002 | Lin et al. .................... 438/612 |
| 6,570,251 | B1 * | 5/2003 | Akram et al. ............... 257/738 |
| 6,596,619 | B1 * | 7/2003 | Wang et al. ................. 438/612 |
| 2004/0092092 | A1 * | 5/2004 | Yang .......................... 438/612 |

* cited by examiner

Primary Examiner—Carl Whitehead, Jr.
Assistant Examiner—Jennifer M. Dolan
(74) Attorney, Agent, or Firm—Bacon & Thomas, PLLC

(57) ABSTRACT

A method of forming a plurality of bumps over a wafer mainly comprises the steps of providing a wafer having a plurality of bonding pads, forming an adhesive layer on the surface of the wafer to cover the bonding pads, patterning the adhesive layer to expose the bonding pads to form a patterned adhesive layer, forming a barrier layer and a wetting layer on the patterned adhesive layer and the surface of the wafer, removing the barrier layer and the wetting layer not covering the patterned adhesive layer, forming a plurality of bumps on the patterned wetting layer, and reflowing the bumps.

21 Claims, 9 Drawing Sheets

BUMPING PROCESS

BACKGROUND OF THE INVENTION

1. Field of Invention

This invention relates to a bumping process. More particularly, the present invention is related to a method for patterning the adhesive layer of the UBM layer (Under Bump Metallurgy layer) and then forming a barrier layer and a wetting layer on said patterned adhesive layer.

2. Related Art

In this information explosion age, integrated circuit products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuit package. Moreover, compared with a wire-bonding package or a tape automated bonding (TAB) package, a flip-chip package uses a shorter electrical path on average and has a better overall electrical performance. In a flip-chip package, the bonding pads on a die and the contacts on a substrate are connected together through a plurality of bumps formed by the method of bumping process. Accordingly, the technology of bumping process becomes more and more important in the advanced packaging fields.

Referring to FIG. 1A, it shows a flow chart illustrating the process flow of a conventional bumping process. The conventional bumping process mainly comprises the following steps. Firstly, a substrate is provided as shown in the step of S100. The substrate may be a silicon base or a wafer. Next, an under bump metallurgy layer is formed on the substrate as shown in the step of S102. Generally speaking, the under bump metallurgy is made of an adhesive layer, a barrier layer and a wetting layer. Then, the step S104 of patterning the barrier layer and the wetting layer is performed to define the locations for disposing bumps. Namely, a photo-resist is formed to cover the portions of the wetting layer and the barrier layer for disposing the bumps thereon and then the residual portions of the wetting layer and the barrier layer not covered by the photo-resist layer are removed to expose the adhesive layer. Afterwards, as shown in the step of S106, another photo-resist layer is provided to cover the exposed adhesive layer to expose the residual portions of the wetting layer, and the step of plating process is then performed to form solder bumps on the residual portions of the wetting layer. Next, as shown in the step of S108, the portions not covered by the solder bumps are removed. Finally, the bumps are reflowed (step of S110) to be fixed securely on the residual portions of the wetting layer and to be shaped into a ball-like shape.

Next, referring to FIG. 1B, it shows a flow chart illustrating the process flow of another conventional bumping process. This conventional bumping process mainly comprises the following steps. Firstly, a substrate is provided as shown in the step of S200. The substrate may also be a silicon base or a wafer. Next, an under bump metallurgy layer is formed on the substrate as shown in the step of S202. Generally speaking, the under bump metallurgy is made of an adhesive layer, a barrier layer and a wetting layer. Then, the step S204 of forming bumps above the bonding pads of the substrate and on the portions of the wetting layer not covered by a patterned photo-resist layer is performed. Next, as shown in the step of S206, the bumps are served as masks so as to perform the removing process to remove the portions of the wetting layer and the barrier layer not covered by the bumps so as to expose the adhesive layer. Then, as shown in the step of S208, the portions of the adhesive layer not covered by the wetting layer and the barrier layer is removed. Finally, as shown in the step of S210, the bumps are reflowed to be fixed securely on the residual portions of the wetting layer and to be shaped into ball-like shape.

In the aforementioned conventional bumping processes, the under bump metallurgy layer applicable to bumping process for the copper wafer mainly comprises a titanium layer, a nickel-vanadium layer and a copper layer. Therein, a hydrogen-fluorine solution (HF) and a aquaforits ($HNO_3$) are usually taken as etchants to patterning the copper layer; a sulfuric acid solution ($H_2SO_4$) or a dilute phosphoric solution comprising deionized water (DI water), phosphoric acid ($CH_3COOH$), acetic acid ($H_3PO4$) and hydrogen peroxide ($H_2O_2$), wherein the composition of said etchant can be refereed to U.S. Pat. No. 5,508,229, is taken as an etchant to define the nickel-vanadium layer. The hydrogen-fluorine solution or the mixed solution comprising ammonium hydroxide and hydrogen-Fluorine (HF) as shown in U.S. Pat. No. 6,013,572 and U.S. Pat. No. 5,162,257 are usually taken as the etchants to define the titanium layer. Moreover, the mixed solution comprising hydrogen peroxide ($H_2O_2$), EDTA and potassium sulfate ($K_2SO_4$) as shown in U.S. Pat. No. 5,462,638 is taken as an etchant to pattern the adhesive layer made of titanium-tungsten. In addition, the mixed solution comprising hydrochiloric is taken as an etchant to pattern the adhesive layer made of chromium as shown in U.S. Pat. No. 5,162,257.

Besides, the under bump metallurgy layer applicable to bumping process for the aluminum wafer mainly comprises an aluminum layer, a nickel-vanadium layer and a copper layer. The etchant for patterning the aluminum layer comprises phosphoric acid, acetic acid and deionized water (DI). Therein, 83% of the etchant is phosphoric acid; 11% of the etchant is acetic acid; and 6% of the etchant is deionized water wherein the composition of the etchant can be referred to U.S. Pat. No. 5,508,229. However, not only the process shown in FIG. 1A but also the process specified in FIG. 1B, the step of patterning the adhesive layer is performed after the barrier layer and the wetting layer are defined or patterned.

However, the steps of the mentioned-above bumping process usually at least cause the side of one portion of the patterned adhesive layer disposed above the bonding pad to be undercut. Namely, there is at least one undercut formed at the side of one portion of the patterned adhesive layer so as to make the cross-sectional area of the adhesive layer smaller and smaller. In such a manner, the mechanical strength of the under bump metallurgy layer will be reduced and the external force will cause the under bump metallurgy layer damaged more easily at the adhesive layer.

Therefore, providing another method for forming bumps to solve the mentioned-above disadvantages is the most important task in this invention.

SUMMARY OF THE INVENTION

In view of the above-mentioned problems, an objective of this invention is to provide a method of forming bumps to avoid an undercut at the side of the adhesive layer and to avoid reducing the mechanical strength of the under bump metallurgy layer so as to increase the reliability of the bumping process.

To achieve these and other advantages and in accordance with the purpose of the invention, as embodied and broadly described herein, the invention provides a method of forming an adhesive layer on the active surface of the wafer, patterning the adhesive layer to remove the portions of the adhesive layer not covering the bonding pads to form a patterned adhesive layer, forming a barrier layer and a wetting layer to cover the patterned adhesive layer and the active surface of the wafer in sequence and then patterning the barrier layer and the wetting layer through the steps of disposing a photo-resist layer, etching the photo-resist layer and development process. Therein, the step of patterning the adhesive layer is performed to remove the potions of the adhesive layer not covering the bonding pads or to form a redistributed layer to provide redistributed pads for disposing bumps thereon.

As mentioned above, after the adhesive layer is patterned to form a patterned adhesive layer, the step of patterning the barrier layer and the wetting layer is performed to avoid an undercut formed at the side of the under bump metallurgy layer. Namely, the side of the patterned adhesive layer will be aligned with the patterned barrier layer and the patterned wetting layer well. In other words, the projective area of said patterned adhesive layer is larger than the projective area of the patterned barrier layer or the patterned wetting layer. In such a manner, the mechanical strength of the under bump metallurgy layer will be increased and prevent from forming an undercut as shown in FIG. 2.

It is to be understood that both the foregoing general description and the following detailed description are exemplary, and are intended to provide farther explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1A:
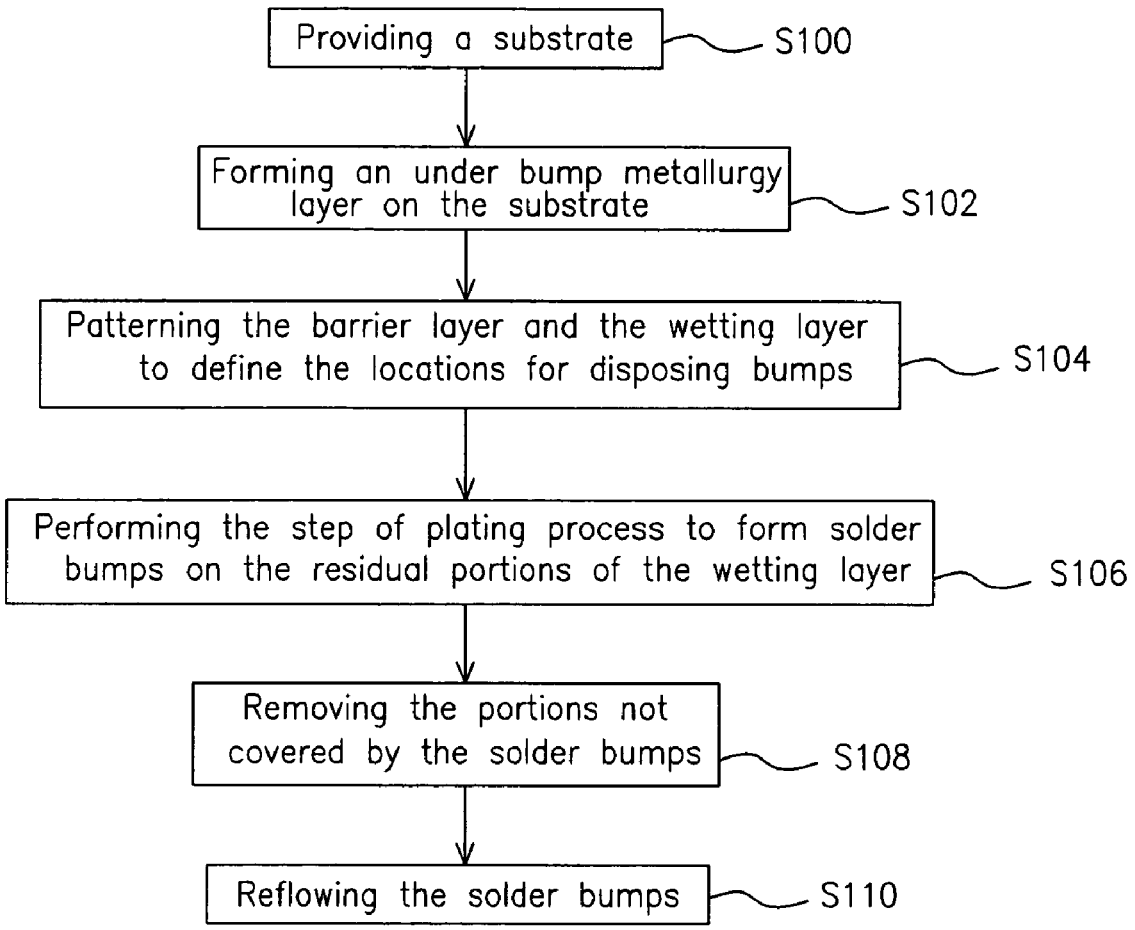
FIG. 1A illustrates a flow chart of the process flow of a conventional bumping process.
Figure 1B:
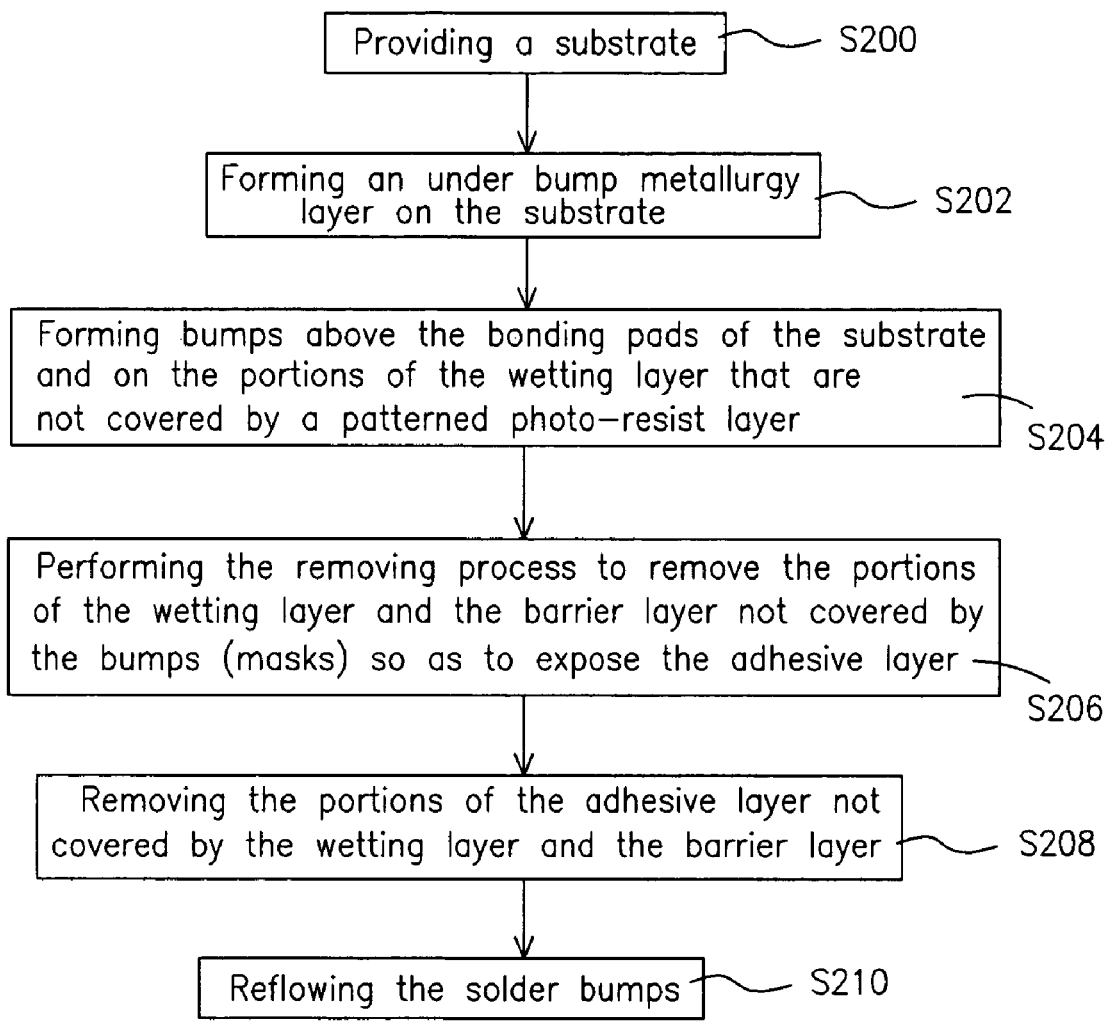
FIG. 1B illustrates a flow chart of the process flow of another conventional bumping process.
Figure 2:
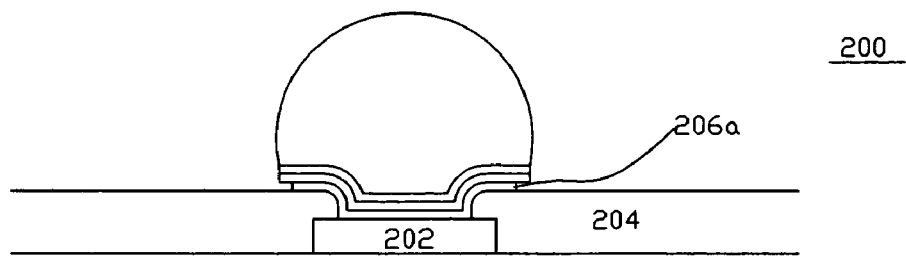
FIG. 2 illustrates an undercut of the under bump metallurgy layer formed by a conventional bumping process.

The method of forming bumps according to the preferred embodiment of this invention will be described herein below with reference to the accompanying drawings, wherein the same reference numbers are used in the drawings and the description to refer to the same or like parts.

FIGS. 3 to 11 are partially enlarged cross-sectional views showing the progression of steps for forming a bump according to the first preferred embodiment of this invention.

Figure 3:
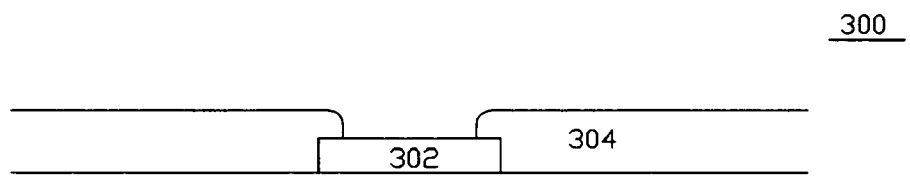
FIGS. 3 to 11 are partially enlarged cross-sectional views showing the progression of steps for forming a bump according to the first preferred embodiment of this invention.

As shown in FIG. 3, a silicon wafer 300 having a plurality of bonding pads 302 and a passivation layer 304. Therein, the passivation layer 304 covers the active surface of the silicon wafer 300 and exposes the bonding pads 302.

Figure 4:
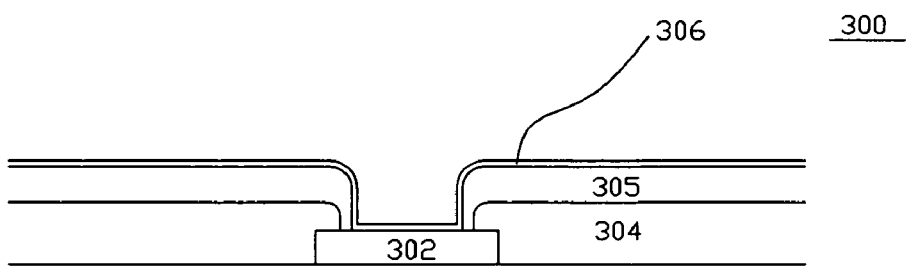

Next, referring to FIG. 4, a dielectric layer 305 is formed above the passivation layer 304 and exposes the bonding pads 302. Therein, the dielectric layer 305 can be made of the material selected from one of polyimide, Benzocyclobutene (BCB) and polymer. Next, a first electrically conductive layer 306 is formed on the dielectric layer 305 wherein the first electrically conductive layer 306 comprises an adhesive layer contacting the bonding pads 302. For example, the adhesive layer comprises a titanium layer or a copper layer.

Figure 5:
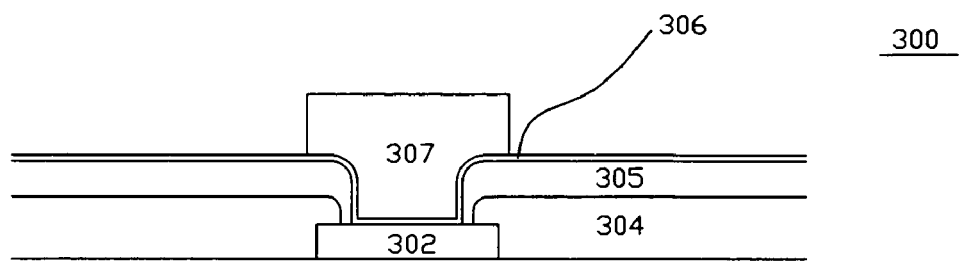
Figure 6:
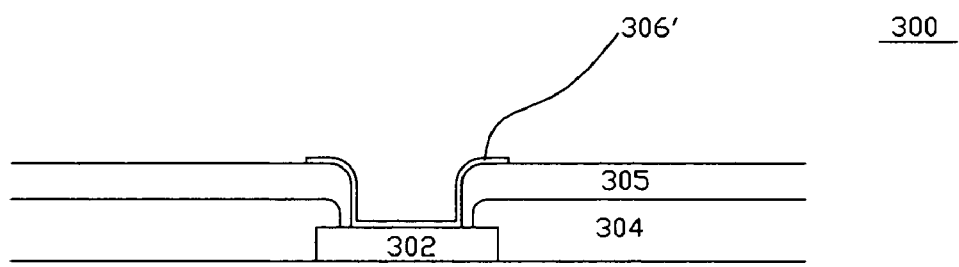

Next, referring to FIG. 5 and FIG. 6, a first photo-resist layer 307 is formed on portions of the first electrically conductive layer 306 which is disposed above the bonding pads in order to pattern the first electrically conductive layer 306 by removing the portions of the first electrically conductive layer 306 not covered by the first photo-resist layer 307 so as to form a patterned electrically conductive layer 306' covering the bonding pads 302.

Figure 7:
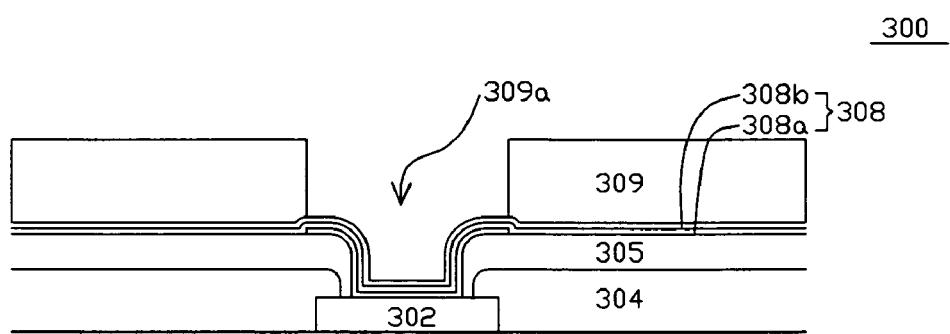

Afterwards, as shown in FIG. 7, a second electrically conductive layer 308 is formed on the patterned first electrically conductive layer 306' and the dielectric layer 305 and then portions of the second electrically conductive layer 308 is covered by a second photo-resist layer 309 wherein the second photo-resist layer have a plurality of openings 309a exposing the other portions of the second electrically conductive layer 308 disposed above the bonding pads 302 and not covered by the second photo-resist layer to define the locations for forming bumps. Therein, the second electrically conductive layer 308 may comprise two different layers. For example, a barrier layer 308a is formed on the patterned first electrically conductive layer 306' and the dielectric layer 305, and a wetting layer 308b is formed on the barrier layer 308a.

Figure 8:
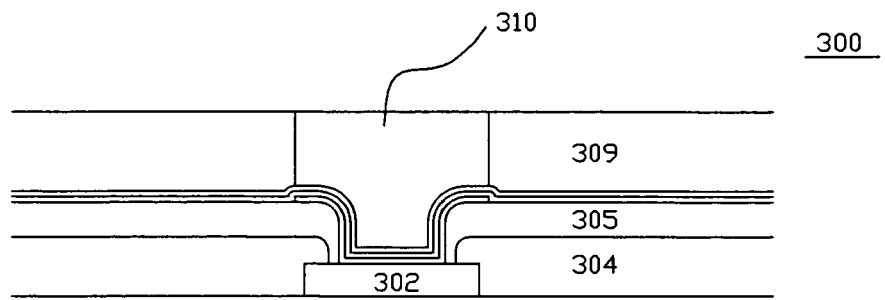

Next, referring to FIG. 8, a solder material is filled in the openings 309a so as to form a plurality of solder bumps 310. Therein, the solder material is formed by the method of plating and said solder material may be selected from one of lead-free and solder eutectic. As mentioned above, all the portions of the patterned first electrically conductive layer 306' are electrically connected with each other through the second electrically conductive layer 308 so as to perform the plating process to form bumps.

Figure 9:
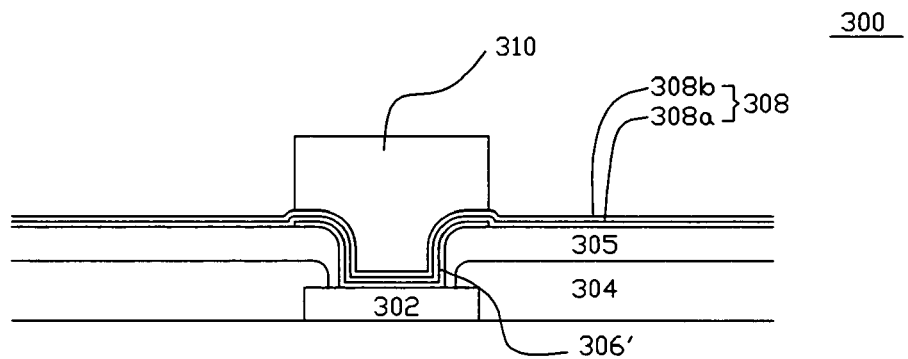
Figure 10:
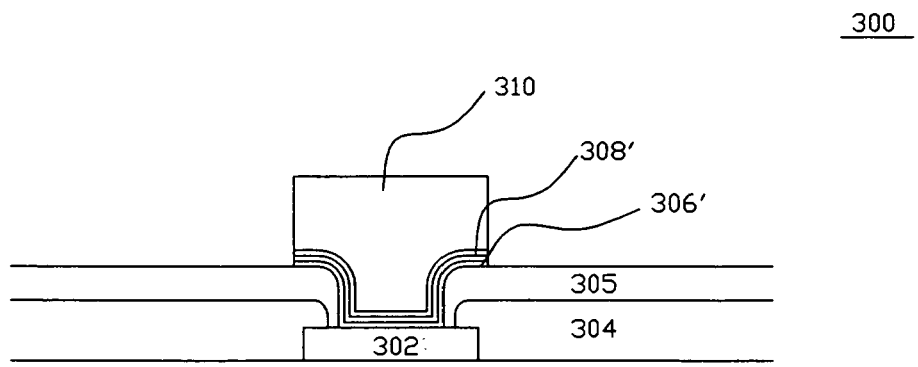

Moreover, as shown in FIG. 9 and FIG. 10, after the bumps 310 are formed and the photo-resist layer 309 is removed, the bumps 310 will be taken as masks to remove the second electrically conductive layer 308 not covered by the bumps 310 to from the patterned second electrically conductive layer 308' comprising the patterned barrier layer and the patterned wetting layer.

In this embodiment, the patterned first electrically conductive layer 306' may comprises a titanium layer or a copper layer; and the patterned second electrically conductive layer 308' may comprises two layers made of a nickel-vanadium layer and a copper layer or may comprise three layers made of a titanium layer, a nickel-vanadium layer and a copper layer. Moreover, the patterned second electrically conductive layer 308' may be composed of a copper layer.

Figure 11:
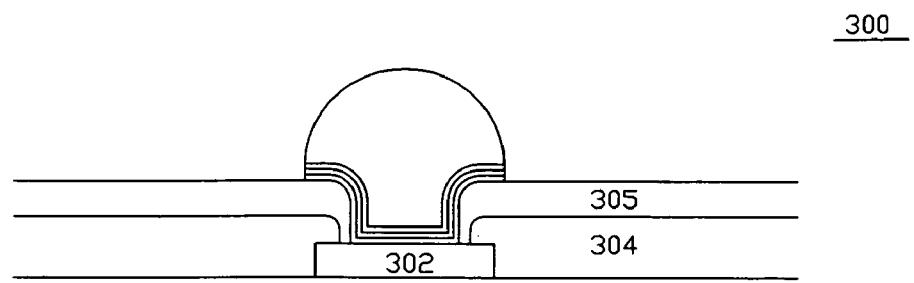

Finally, as shown in FIG. 11, a reflowed process is performed to shape the bumps into a ball-like shape.

Next, as shown from FIGS. 12 to 19, they are partially enlarged cross-sectional views showing the progression of steps for forming a bump according to the second preferred embodiment of this invention.

Figure 12:
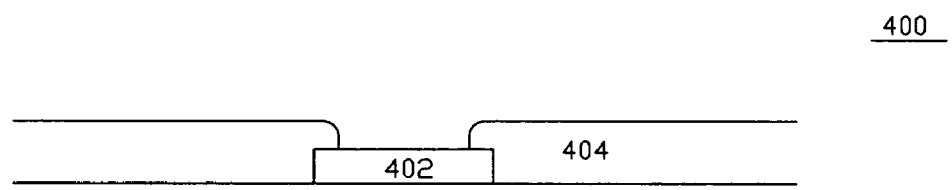
FIGS. 12 to 20 are partially enlarged cross-sectional views showing the progression of steps for forming a bump according to the second preferred embodiment of this invention.

As shown in FIG. 12, a silicon wafer 400 having a plurality of bonding pads 402 and a passivation layer 404. Therein, the passivation layer 404 covers the active surface of the silicon wafer 400 and exposes the bonding pads 402.

Figure 13:
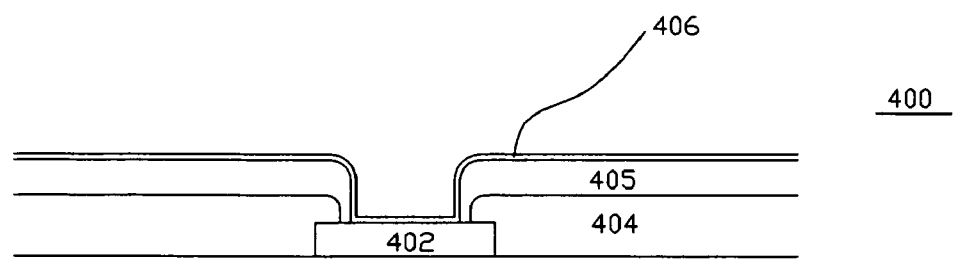

Next, referring to FIG. 13, a dielectric layer 405 is formed above the passivation layer 404 and exposes the bonding pads 402. Therein, the dielectric layer 405 can be made of the material selected from one of polyimide, Benzocyclobutene (BCB) and polymer. Next, a first electrically conductive layer 406 is formed on the dielectric layer 405 wherein the first electrically conductive layer 406 comprises an adhesive layer contacting the bonding pads 402. For example, the adhesive layer comprises a titanium layer or a copper layer.

Figure 14:
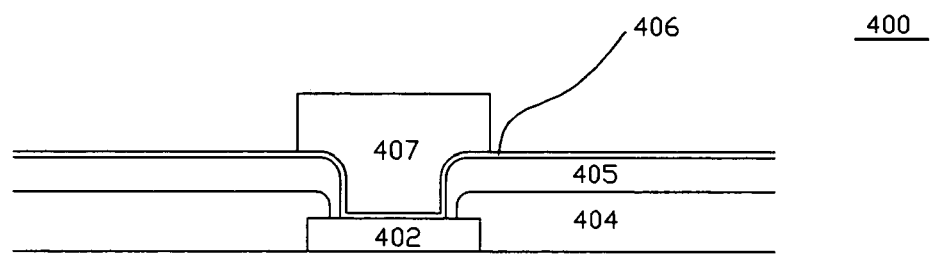
Figure 15:
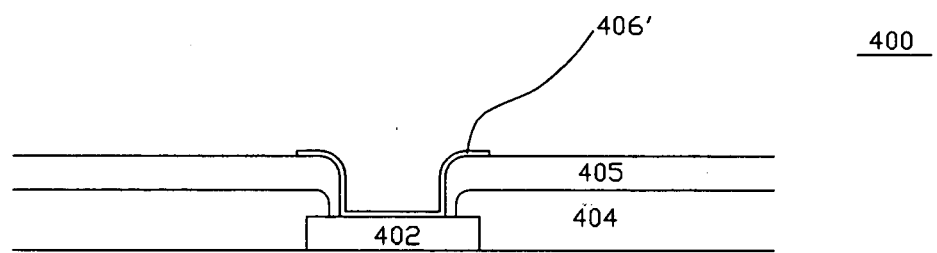

Next, referring to FIG. 14 and FIG. 15, a first photo-resist layer 407 is formed on the first electrically conductive layer 406 which is disposed above the bonding pads 402 in order to pattern the first electrically conductive layer 406 by removing the portions of the first electrically conductive layer 406 not covered by the first photo-resist layer 407 so as to form a patterned first electrically conductive layer 406'.

Figure 16:
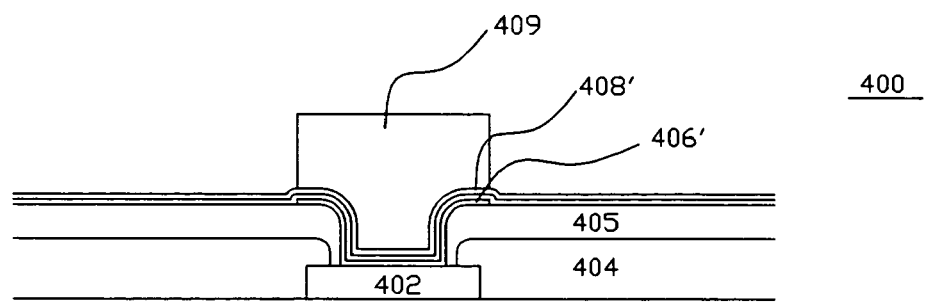

Afterwards, as shown in FIG. 16, a second electrically conductive layer 408 is formed on the patterned first electrically conductive layer 406' and the dielectric layer 405 and then portions of the second electrically conductive layer 408 disposed above the bonding pads 402 is covered by a second photo-resist layer 409. Therein, the second electrically conductive layer 408 may comprise two different layers. For example, a barrier layer 408a is formed on the patterned first electrically conductive layer 406' and the dielectric layer 405, and a wetting layer 408b is formed on the barrier layer 408a.

Figure 17:
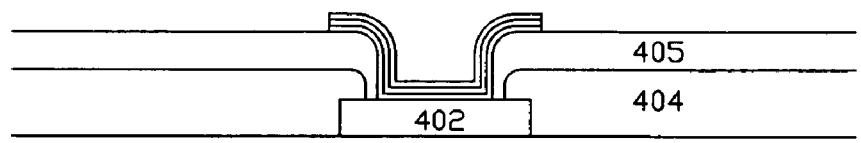

Next, referring to FIG. 17, the step of removing the portions of the second electrically conductive layer 408 not covered by the first photo-resist layer 409 is performed so as to pattern the second electrically conductive layer 408 to form a patterned second electrically conductive layer 408' and expose the dielectric layer 405. It should be noted that the patterned second electrically conductive layer 408' may comprise a patterned barrier layer formed on the patterned first electrically conductive layer 406' and the patterned wetting layer formed on the patterned barrier layer.

As mentioned above, the patterned first electrically conductive layer 406' may comprise a titanium layer or an aluminum layer; and the patterned second electrically conductive layer 408' may comprise a nickel-vanadium layer, a copper layer. Moreover, the patterned second electrically conductive layer 408' may also comprise a titanium layer, a nickel-vanadium layer and a copper layer. In addition, the patterned second electrically conductive layer 408' may compose of a copper layer.

Figure 18:
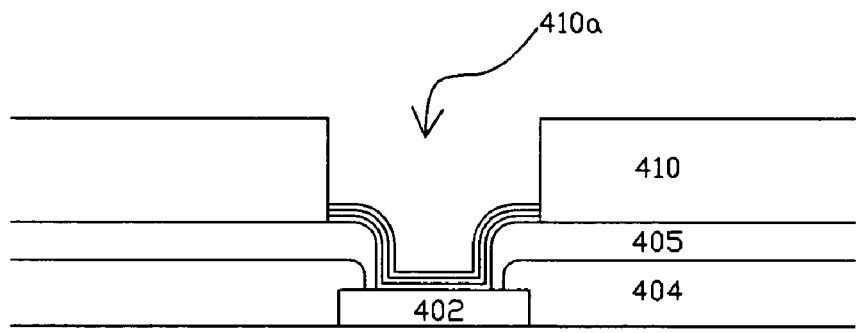
Figure 19:
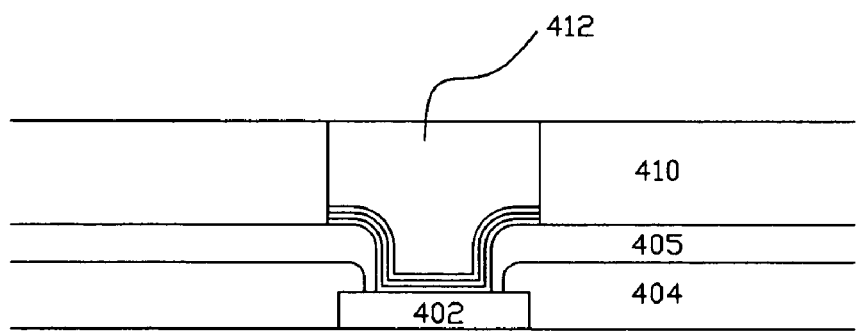

Next, as shown in FIG. 18, a second photo-resist layer 410 is formed on the patterned second electrically conductive layer 408' and the exposed dielectric layer 405 so that the second photo-resist layer defines a plurality of openings 410a exposing portions of the patterned second electrically conductive layer 408' disposed above the bonding pads 402 to define the locations for forming bumps thereon.

Afterwards, a solder material is filled in the openings 410a so as to form a plurality of solder bumps 412. Therein, the solder material is formed by the method of screen-printing and said solder material may be selected from one of lead-free and solder eutectic. Moreover, the solder bumps 412 can be formed by disposing a plurality of solder balls in the openings 410a.

Figure 20:
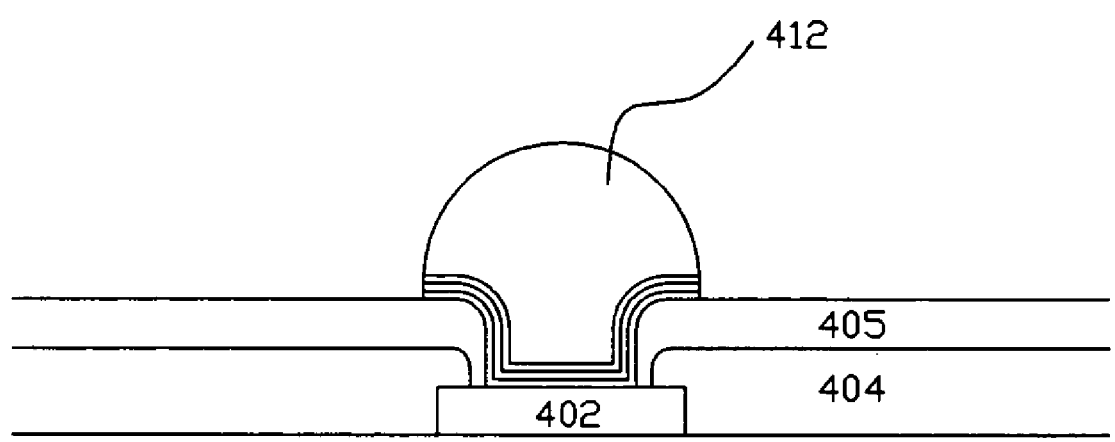

Finally, as shown in FIG. 20, a reflowed process is performed to shape the bumps into a ball-like shape.

In the first and second embodiments, after the first electrically conductive layer is patterned, the steps of disposing the second electrically conductive layer on the patterned first electrically conductive layer and patterning the second electrically conductive layer are performed to avoid an undercut formed at the side of one portion of the patterned first electrically conductive layer or the patterned second electrically conductive layer. Namely, the side of the patterned first electrically conductive layer will be aligned with the patterned second electrically conductive layer, and the projective area of the patterned first electrically conductive layer will be larger than the projective area of the patterned second electrically conductive layer. In such a manner, the mechanical strength of the under bump metallurgy layer will be increased.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming a plurality of bumps on a wafer having an active surface, wherein the wafer further comprises a plurality of bonding pads formed on the active surface and a passivation layer formed on the active surface to expose the bonding pads, the method comprising the sequential steps of:

forming an adhesive layer over the active surface of the wafer, wherein the adhesive layer covers the bonding pads and the passivation layer;

removing only portions of the adhesive layer not covering the bonding pads to form a patterned adhesive layer;

forming a barrier layer above the patterned adhesive layer and the passivation layer;

forming a wetting layer on the barrier layer;

removing portions of the wetting layer not disposed above the bonding pads to form a patterned wetting layer; and removing portions of the barrier layer not covered by the patterned wetting layer to form a patterned layer.

2. The method of claim 1, further comprising the step of forming a plurality of bumps on the patterned wetting layer.

3. The method of claim 2, further comprising the step of reflowing the bumps after the bumps are formed on the patterned wetting layer.

4. The method of claim 1, wherein the step of removing the portions of the adhesive layer not covering the bonding pads comprises the sub-steps of forming a photo-resist layer on the adhesive layer, patterning the photo-resist layer to form a patterned photo-resist layer, and removing the portions of the adhesive layer according to the patterned photo-resist layer.

5. The method of claim 1, further comprising the step of forming a plurality of bumps above the bonding pads to serve as masks to pattern the barrier layer and the wetting layer.

6. The method of claim 5, wherein the bumps are formed by the method of plating.

7. The method of claim 1, further comprising the step of forming a dielectric layer interposed between the passivation layer and the adhesive layer, and exposing the bonding pads.

8. The method of claim 7, wherein the dielectric layer is made of polyimide.

9. The method of claim 7, wherein the dielectric layer is made of Benzocyclobutene.

10. The method of claim 1, wherein the adhesive layer is made of a material selected from one of titanium, titanium-tungsten, aluminum and chromium.

11. The method of claim 1, wherein the barrier layer is made of a material selected from one of nickel-vanadium, nickel, chromium-copper and nickel-titanium.

12. A method of forming a plurality of bumps on a wafer having an active surface, wherein the wafer further comprises a plurality of bonding pads formed on the active surface and a passivation layer formed on the active surface to expose the bonding pads, the method comprising the sequential steps of:
   forming a first electrically conductive layer over the active surface of the wafer, wherein the first electrically conductive layer covers the bonding pads and the passivation layer;
   removing only portions of the first electrically conductive layer not covering the bonding pads to form a patterned first electrically conductive layer;
   forming a second electrically conductive layer above the patterned first electrically conductive layer and the passivation layer, wherein the second electrically conductive layer directly contacts the patterned first electrically conductive layer; and
   removing portions of the second electrically conductive layer not covering the patterned first electrically conductive layer to form a patterned second electrically conductive layer.

13. The method of claim 12, further comprising the step of forming a plurality of bumps on the patterned second electrically conductive layer.

14. The method of claim 13, wherein the bumps are formed by the method of screen-printing.

15. The method of claim 12, wherein the step of removing the portions of the second electrically conductive layer not covering the patterned first electrically conductive layer comprises the sub-steps of forming a photo-resist layer on the second electrically conductive layer, patterning the photo-resist layer to form a patterned photo-resist layer, and removing the portions of the second electrically conductive layer according to the patterned photo-resist layer.

16. The method of claim 12, further comprising the step of forming a plurality of bumps on portions of the second electrically conductive layer covering the patterned first electrically conductive layer to serve as masks to pattern the second electrically conductive layer.

17. The method of claim 12, further comprising the steps of forming a dielectric layer interposed between the passivation layer and the first electrically conductive layer and exposing the bonding pads.

18. The method of claim 17, wherein the dielectric layer is made of polyimide.

19. The method of claim 17, wherein the dielectric layer is made of Benzocyclobutene.

20. The method of claim 12, wherein the first electrically conductive layer is made of a material selected from one of titanium, titanium-tungsten, aluminum and chromium.

21. The method of claim 12, wherein the second electrically conductive layer is made of a material selected from one of the nickle-vanadium, nickel, chromium-copper, copper and nickel-titanium.

* * * * *